United States Patent [19]

Seiler

[11] Patent Number: 4,933,065

[45] Date of Patent: Jun. 12, 1990

[54] APPARATUS FOR APPLYING DIELECTRIC OR METALLIC MATERIALS

[75] Inventor: Reiner Seiler, Hanau, Fed. Rep. of Germany

[73] Assignee: Leybold Aktiengesellschaft, Hanau, Fed. Rep. of Germany

[21] Appl. No.: 280,325

[22] Filed: Dec. 6, 1988

[30] Foreign Application Priority Data

Oct. 8, 1988 [DE] Fed. Rep. of Germany ....... 3834318

[51] Int. Cl.$^5$ .............................................. C23C 14/46
[52] U.S. Cl. .......................... 204/298.06; 204/192.11; 204/298.07; 204/298.09; 204/298.16; 204/298.24
[58] Field of Search ................... 204/298 BD, 298 PI, 204/298 TT, 298 CS, 298 TS, 298 ME, 298 SC, 298 SM, 192.11

[56] References Cited

U.S. PATENT DOCUMENTS

| 3,408,283 | 10/1968 | Chopra et al. | 204/298 |
| 4,108,751 | 8/1978 | King | 204/192.31 |
| 4,424,103 | 1/1984 | Cole | 204/192 |
| 4,885,070 | 12/1989 | Campbell et al. | 204/192.11 |

FOREIGN PATENT DOCUMENTS

| 2407924 | 8/1974 | Fed. Rep. of Germany | 204/298 |
| 3726006 | 2/1988 | Fed. Rep. of Germany | . |
| 3708717 | 9/1988 | Fed. Rep. of Germany | . |

Primary Examiner—Aaron Weisstuch
Attorney, Agent, or Firm—Felfe & Lynch

[57] ABSTRACT

In an apparatus for applying materials to a substrate (15) disposed in a vacuum chamber (17), having an electron emitter (9) and having magnet coils (30, 39) disposed outside of the vacuum chamber (16, 17), the electron emitter (9) is disposed in a separate generator chamber (37) communicating with the vacuum chamber (17) and forming the anode (11) and, after the introduction of the process gas into the generator chamber (37), produces a large-area plasma jet (S) which, under the action of magnets (12, 21), passes through an opening (25) in the wall (28) of the vacuum tank (1) forming the vacuum chamber (16, 17). The positive ions are accelerated, by application of a variable negative voltage, from the plasma jet (S) onto the target (7) of drum-shaped configuration mounted in the vacuum chamber (17) for rotation on a pedestal (24), from which target the sputtered metal atoms are deflected onto the substrate (15).

9 Claims, 1 Drawing Sheet

U.S. Patent    Jun. 12, 1990    4,933,065
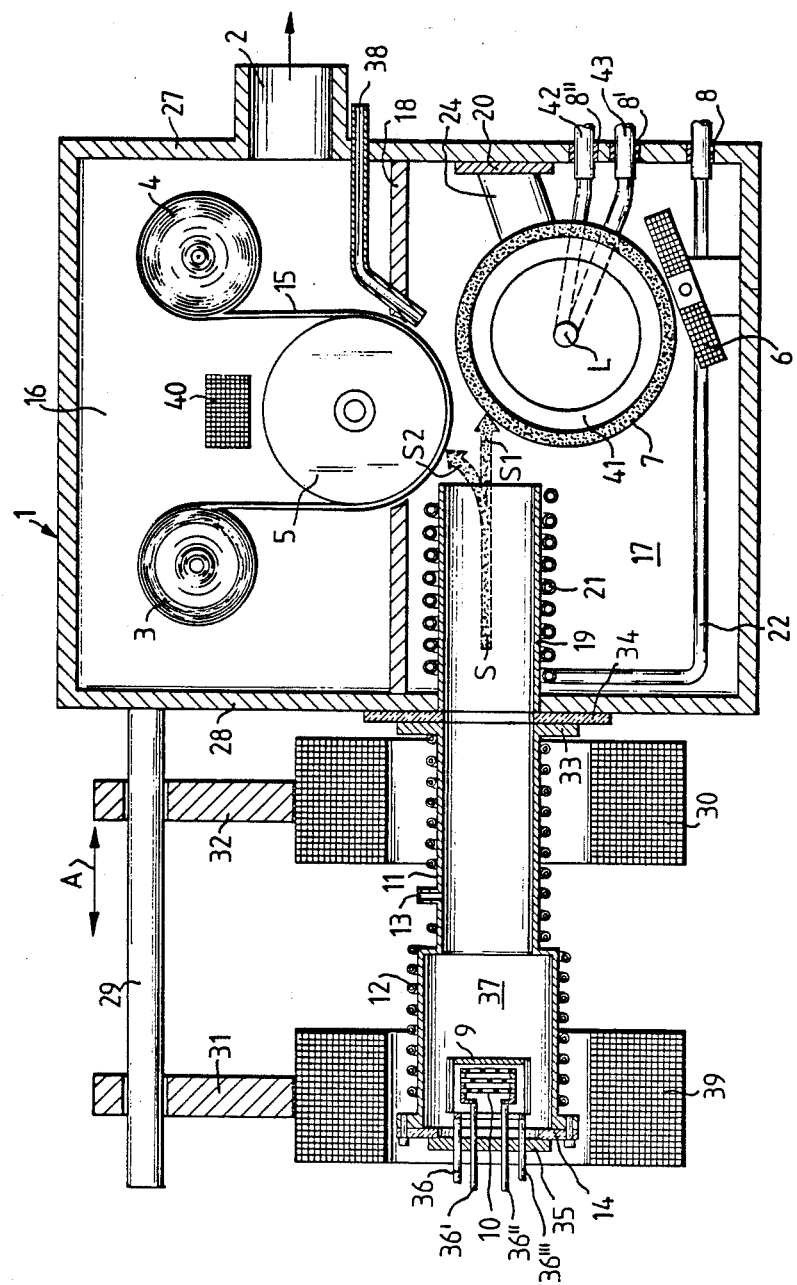

APPARATUS FOR APPLYING DIELECTRIC OR METALLIC MATERIALS

BACKGROUND OF THE INVENTION

The invention concerns an apparatus for applying dielectric or metallic materials onto a substrate disposed in a vacuum chamber, having an electron emitter and having magnet coils disposed in the area of the vacuum chamber, the electron emitter being disposed in a separate generator chamber communicating with the vacuum chamber and forming the anode and, after the introduction of the process gas through an inlet connection, producing a large-area plasma jet which is guided by the action of the magnets between the electron emitter and a target provided in the vacuum chamber, while the positive ions are accelerated from the plasma jet to the target by applying a variable negative voltage, and the metal atoms dislodged from the target reach the substrate.

A method is known for producing transparent thermal mirrors by depositing a film of treated indium oxide or treated tin oxide onto a substrate (EU Pat. 0 020 456), in which the method of deposition is a low-temperature deposition onto a polymer substrate by sputtering, thermal evaporation, vacuum depositing or electron bombardment. During the deposition an oxygen partial pressure is used in a range which directly produces films of the said material with a high transparency and a high reflectance.

In the apparatus used for the practice of this prior art method, a water-cooled target is disposed at an angle of about 45 degrees with respect to the ion jet produced by a jet source, in the vacuum chamber provided with a gas inlet, the ejected target source material producing a coating of the polymer substrate disposed at an angle to the target.

Also known is a plasma generator with an ion jet generator (article by D. M. Goebel, G. A. Campbell and R. W. Conn in the JOURNAL OF NUCLEAR MATERIAL 121 (1984), 277–282, North Holland Physics Publishing Division, Amsterdam), which is disposed in a separate chamber connected to the vacuum chamber, the approximately cylindrical chamber wall of this separate chamber forming the anode and being provided with an inlet for the process gas. The cylindrical chamber is provided with annular magnet coils and with tubes for cooling the chamber wall. The electron emitter itself is situated on a part of the wall which closes the one end of the cylindrical chamber and faces away from the actual vacuum vessel.

Lastly, an apparatus is known (P 37 31 693.1) for the application of materials, in which the electron emitter is provided in a separate generator chamber communicating with the vacuum chamber and forming the anode, and the target is provided in the vacuum chamber, the target having an approximately plate-like configuration and being connected to a coolant circuit.

SUMMARY OF THE INVENTION

It is the purpose of the present invention to create an apparatus for high-rate sputtering by means of an externally generated plasma, in which the power that can be delivered to the target is especially great and in which the target has a long useful life and is subjected to very uniform ablation.

This purpose is accomplished in accordance with the invention in that the target has an approximately cylindrical or drum-shaped configuration and is held on a pedestal in the immediate vicinity of the substrate for motor-driven rotation about its longitudinal axis.

BRIEF DESCRIPTION OF THE DRAWING

The invention admits of a great variety of embodiments; one of them is shown in longitudinal section in a purely schematic manner in the appended drawing representing an apparatus with a separate plasma source for coating bands and films.

DETAILED DESCRIPTION OF THE PREFERRED EMBODIMENT

The coating apparatus consists essentially of a vacuum tank 1 with a pumping port 2, the supply roll 3 and take-up roll 4 rotatably mounted in the vacuum tank 1, the coating roll 5 which also is rotatably mounted, the partition wall 18 dividing the vacuum tank 1 into two chambers 16 and 17, the tube 19 running transversely in the vacuum tank 1 parallel to the partition wall 18, with the tube 22 wound on it and forming a magnet coil 21 and a cooling coil. A drum-shaped target 7 is journalled on a shaft L held on a pedestal 24 at an angle to the partition wall 18 and to the tube 19. The two tubes 42 and 43 carry the electric current and the coolant water, which, like the tube 22, are brought sealingly through the one end wall 27 of the vacuum tank 1 at 8, 8', 8".

The coating apparatus furthermore has a rail 29 fixedly disposed on the other end wall 28 of the vacuum tank, and on it the magnet coils 30, 39, with their coil mounts 31, 32, are guided for displacement in the direction of the arrow A. The tubular anode 11 is disposed concentrically with the magnet coils 30, 39; its longitudinal axis is aligned with the longitudinal axis of the tube 19 in the chamber 17 of the vacuum tank 1, and its end remote from the vacuum tank 1 is closed with an insulator 14 bearing an electron emitter 9 with heater 10.

At its end facing the vacuum tank 1, the anode 11 has a flange 33 whereby it is held on the end wall 28 of the vacuum tank 1, but between the flange 33 and the end wall 28 an insulator 34 is disposed which insulates the tubular anode 11 electrically from the tube 19 and the end wall 28. The tubular anode 11 is provided laterally with an inlet connection 13 running radially outwardly, and is enveloped by a coil of tubing 12 through which coolant water flows. The insulator 14 is affixed to a perforated plate 35 in which the water and electric power lead-throughs 36, 36', 36", and 36''' are provided.

In the interior of the tube-shaped, evacuated generator chamber 37, electrons are emitted from the electron emitter 9 in a large area and are accelerated to the anode 11. A plasma is ignited by gas which is simultaneously admitted into the generator chamber 37 through the connection 13.

Through the magnet coils 6, 30, 21, 39, which are provided both in the area of the generator chamber 37 and at the target 7, the plasma is restricted to a tubular area between the electron emitter 9, the generator chamber 37, and the target 7. The magnetic field causes the emitted primary electrons to drift along the lines of force and can reach the anode 11 only through collisions, while secondary electrons knocked from the drum-shaped, rotating target 7, which also contribute to the ionization, are captured. The ions thus produced likewise drift along the magnetic lines of force toward the substrate 15. Thus, an ion jet of high intensity (of an order of magnitude of as much as 1 A/cm$^2$) is available at the target 7. The energy of the ions, however, is low. If a negative potential is now applied to the target 7, the ions are accelerated out of the marginal layer of the plasma.

By altering the magnetic field it is possible to "bend" the plasma jet by as much as 90 degrees. Consequently, the installed length of the target 7 relative to the longitudinal axis of the generator chamber 37 or to the tube 19 can be virtually as desired.

In metallic cathode sputtering, argon gas is admitted into the generator chamber 37, an argon plasma is ignited, and a voltage ranging from 100 V to 1 kV is applied to the target. Conditions prevail on the target surface similar to those in DC cathode sputtering, resulting in comparable properties of the deposited coatings. The following advantages over DC cathode sputtering are obtained:

The power that can be delivered to the target is significantly greater. For example, with an ion current of 1 A/cm$^2$ and a target voltage of 750 V, a power per unit area of 750 W/cm$^2$ is obtained. This is to be compared with a maximum power per unit area of several tens of watts per square centimeter in DC magnetron cathode sputtering. The rate of deposition increases accordingly.

The target current and target voltage are controllable independently, whereas in DC cathode sputtering the two magnitudes have an interdependent characteristic. The possibility of independently controlling the current and voltage offers the advantage of permitting the sputtering rate to be controlled through the target current and the property of the deposited coating to be controlled through the target voltage, independently of one another.

In a reactive cathode sputtering close to the substrate 15, if reactive gas is admitted into the chamber 17 through the inlet connection 38, the physical conditions are comparable to those of conventional reactive cathode sputtering.

An important difference is that the electrons producing the ionization are supplied in reactive cathode sputtering by the target 7, and the process therefore reacts very sensitively to changes in the chemical nature of the target surface. In the apparatus herein described, the ions are fed from the outside, and the system behaves much more stably.

The advantages cited for the metallic cathode amplifier bear full fruit in this case. An additional advantage is to be seen in the fact that the intense plasma jet can be used for making the admitted reactive gas more reactive (dissociation of reactive gas molecules, excitation and ionization of reactive gas atoms). The additional masking systems, anodes and anode power supplies necessary as a rule in the reactive sputtering process are eliminated. If the field of the magnet 6 behind the target 7 is sufficiently weakened, and if simultaneously there is a magnet 40 present behind the substrate 15 or if the substrate or substrate holder is magnetic, it is possible to divide the plasma jet into two jets S1, S2, one of which can be used for sputtering a metal target 7 and the second to activate the reactive gas or for the plasma treatment of the substrate 15. In this case the electron temperature can be varied independently in the two jets S1, S2, by appropriate gradations of pressure.

At the high energy densities that can be achieved, it is also possible, if the cooling of the target 7 through the coolant lines 42, 43, and the cooling chamber 41, is sufficiently low, to evaporate a suitable target with the plasma jet.

The intense plasma that is present causes coatings to form which have better properties in comparison to the ordinary evaporating systems, since metal clusters torn away in the plasma are broken up and some of the vaporized metal atoms are ionized.

As far as the machinery is concerned, the described method offers simplifications since, in contrast to ion beam or electron beam evaporation, no high voltage is necessary (typical source voltage 80 V, typical target voltage 700 V).

The plasma jet can be produced on a large area in any desired form. No scanning system is necessary. Inasmuch as the plasma jet is of itself quasi-neutral, manipulation is considerably simplified. Additional systems for neutralizing the jet are unnecessary.

To coat a substrate 15 with an alloy of specific composition it is possible to use an appropriate target 7 and perform a cathode sputtering.

To optimize the useful life and the ablation of the target 7, the latter is of a cylindrical configuration and held for rotation about its longitudinal axis L on the pedestal 24 which is fastened through the insulator 20 to the end wall 27 of the vacuum chamber 1. The target 7 is provided with a cooling chamber 41 which cools the outer layer of sputterable material from the inside. A motor for driving the drum-shaped target 7 is not shown in the drawing.

Of great importance for the correct operation of the apparatus is the arrangement of a magnet coil 21 on the tube 19, which is so disposed in relation to the chamber 17 that it is in line with the tubular generator chamber 37, the tube 19 being a prolongation of the tubular anode 11, while the target 7 is situated in the free space between the tube 19 and the end wall 27. The magnets 12, 21, consist of coils or windings of tubing, the tube 22 not only carrying coolant water but also serving as an electrical conductor and being insulated externally. The additional magnet 40 can be situated either above the coating roll 5 or in the interior of the coating roll 5, or beside it.

I claim:

1. Apparatus for applying dielectric or metallic materials onto a substrate disposed in a vacuum chamber, comprising
   a vacuum chamber;
   a generator chamber communicating with said vacuum chamber, said generator chamber having therein an electron emitter and an inlet for process gas between said emitter and said vacuum chamber, said emitter producing a large area plasma jet after the introduction of said process gas,
   magnetic field producing means for guiding the plasma jet toward the vacuum chamber,
   a drum shaped target provided in the vacuum chamber in the immediate vicinity of the substrate, said target being mounted for rotation about its longitudinal axis;
   means for applying a variable negative voltage to the target to accelerate ions from the plasma jet to the target so that metal atoms dislodged from the target reach the substrate, and
   means for rotating said target continuously about said axis, whereby said target is worn evenly and quality of the substrate coating is correspondingly high.

2. Apparatus in accordance with the claim 1 further comprising an inlet for reactive gas in the vacuum chamber between the target and the substrate, so that the sputtered metal atoms react chemically with the reactive gas before accumulating on the substrate on the substrate's surface layer.

3. Apparatus in accordance with claim 2, wherein the plasma jet is divided into two jets, said apparatus further comprising an auxiliary magnet located near to the substrate so that the first jet sputters the target and the second jet activates the reactive gas in the neighborhood of the substrate.

4. Apparatus in accordance with claim 1, wherein the target is electrically insulated, and the plasma jet has a large area and controllable intensity and is steered by a magnet system onto the electrically-insulated target, said apparatus further comprising means for applying negative voltage to the target so that the positive ions are accelerated from the plasma jet to the target and the evaporated metal atoms are precipitated on the substrate.

5. Apparatus in accordance with claim 1, further comprising means for providing an electrical voltage on or behind the substrate so that the metal ions are accelerated onto the substrate.

6. Apparatus in accordance with claim 1, wherein the drum-shaped target has an inner wall provided with one or more cooling chambers that are connected to a source of coolant.

7. Apparatus in accordance with claim 6, wherein the drum-shaped target having the cooling chamber rotates about a shaft that is equipped with means for the entry and exit of the coolant.

8. Apparatus in accordance with claim 1 characterized in that a magnet is disposed on a holding arm on the side of the drum-shaped target facing away from the substrate, said magnet being adapted to be shifted in its position with respect to the target.

9. Apparatus in accordance with claim 1, wherein the drum-shaped target is disposed with its circumferential surface parallel to the outside surface of the substrate and the substrate is a film that is carried over a coating roll.

* * * * *